(12) United States Patent
Uchida et al.

(10) Patent No.: US 7,497,695 B2
(45) Date of Patent: Mar. 3, 2009

(54) CONNECTION STRUCTURE FOR PRINTED WIRING BOARD

(75) Inventors: Shinji Uchida, Kanagawa (JP); Hiroshi Yamane, Kanagawa (JP); Akihito Funakoshi, Kanagawa (JP); Kazuto Miura, Kanagawa (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 12/071,330

(22) Filed: Feb. 20, 2008

(65) Prior Publication Data

US 2008/0153319 A1 Jun. 26, 2008

Related U.S. Application Data

(62) Division of application No. 10/554,959, filed as application No. PCT/JP2004/005855 on Apr. 23, 2004, now Pat. No. 7,371,074.

(30) Foreign Application Priority Data

Apr. 30, 2003 (JP) ............................. 2003-125680

(51) Int. Cl.
*H01R 12/00* (2006.01)

(52) U.S. Cl. .................... 439/67; 439/495; 439/492

(58) Field of Classification Search ................ 439/492, 439/77, 67, 495, 206; 174/117 F
See application file for complete search history.

(56) References Cited

U.S. PATENT DOCUMENTS 5,219,292 A * 6/1993 Dickirson et al. ............. 439/67
5,397,247 A * 3/1995 Aoki et al. ................. 439/496

5,562,487 A 10/1996 Ii et al.

FOREIGN PATENT DOCUMENTS

JP H05-028066 U 4/1993
JP H07-170076 A 7/1995

(Continued)

OTHER PUBLICATIONS

International Search Report mailed on Aug. 10, 2004.

*Primary Examiner*—Tho D Ta
*Assistant Examiner*—Travis Chambers
(74) *Attorney, Agent, or Firm*—Rader, Fishman & Grauer, PLLC

(57) ABSTRACT

The present invention relates to a connection structure for a printed wiring board to be electrically connected to a FPC. The FPC has an elongated substrate, and plural conductors are laminated on a surface of the substrate for extending along an axial direction of the substrate. The printed wiring board has an insertion opening provided at an edge surface for being inserted by a top end portion of the FPC, and plural line connecting terminals formed on an internal wall surface of the insertion opening. The top end portion of the FPC has a slider including plural elastic deformable first contacts, and a first housing for holding the plurality of contacts. The FPC is inserted into the insertion opening of the printed wiring board such that one end of the first contact presses the conductor and the other end of the first contact presses the line connecting terminal. The FPC can be connected to the printed wiring board on an edge surface thereof, allowing circuit elements to be mounted in high density, and improving freedom in designing wiring patterns.

13 Claims, 5 Drawing Sheets

FOREIGN PATENT DOCUMENTS

| | | |
|---|---|---|
| JP | H07-183070 A | 7/1995 |
| JP | H09-102368 A | 4/1997 |
| JP | H11-288769 A | 10/1999 |
| JP | 2002-015800 A | 1/2002 |
| JP | 2002-083648 A | 3/2002 |
| JP | 2002-158055 A | 5/2002 |

* cited by examiner

CONNECTION STRUCTURE FOR PRINTED WIRING BOARD

This is a divisional application of application Ser. No. 10/554,959 filed on Oct. 28, 2005, claiming Japanese priority No. 2003-125680, filed Apr. 30, 2003 the entirety of which is incorporated by reference for all purposes.

FIELD OF THE INVENTION

The present invention relates to a connection structure for a printed wiring board. More particularly, the present invention relates to a connection structure for a printed wiring board for electrically connecting a FPC (Flexible Printed Circuit) and a printed wiring board formed by stacking plural plate members.

RELATED ART

Modules of electronic parts and printed wiring boards are mounted in electronic devices. Conventionally, FPCs, or Flexible Flat Cables have been used to connect these printed wiring boards and modules of electronic parts.

Here, a printed wiring board comprises a base plate having an insulating substrate and a wiring pattern formed on this substrate, and circuit elements, such as ICs and connectors, which are connected to the wiring pattern on the base plate. ZIF (Zero Insertion Force)-type connectors which enable FPCs to be inserted and removed with little force are connectors used as circuit elements mounted on printed wiring boards (for example, see Japanese Patent Application Laid-open No. 2002-158055).

According to this ZIF-type connector, operability of the FPC and a slider can be improved and connection reliability can be ensured, and miniaturization can be realized as well.

Incidentally, the miniaturization of electronic devices such as mobile phones and mobile devices has been progressing in recent years, and with this miniaturization of electronic devices, the miniaturization and the high-integration of FPC and printed wiring boards are also in demand. Therefore, in order to meet this demand, in recent years, multilayer printed wiring boards formed by stacking plural base plates have come into wide use.

However, although the above ZIF-type connector realizes low height, it occupies a certain area on the base plate because it is mounted on the surface of the base plate. Therefore, there were instances in which mounting of circuit elements with high-density was difficult.

SUMMARY OF THE INVENTION

In order to solve the above problems, an object of the present invention is to provide a connection structure for printed wiring boards wherein circuit elements can be mounted at high density.

The inventors have invented a connection structure for printed wiring boards in order to satisfy the foregoing object.

(1) A connection structure for a printed wiring board to be electrically connected to a FPC, the FPC including:

an elongated substrate, and plural conductors laminated on a surface of the substrate and extending along an axial direction of the substrate;

the printed wiring board including: an insertion opening and plural line connecting terminals, the insertion opening for a top end portion of the FPC to be inserted being provided at an edge surface, the plurality of the line connecting terminals being formed on an internal wall surface of the insertion opening and extending along an insertion direction of the FPC;

the top end portion of the FPC including a slider having plural elastic deformable first contacts, and a first housing for holding the plurality of contacts;

the first contact including one edge portion for pressing the conductor and the other edge portion for pressing the line connecting terminal by inserting the FPC into the insertion opening of the printed wiring board.

The FPC may be a FFC (Flexible Flat Cable).

The substrate may be formed of a thin-film polyimide plate. Furthermore, the substrate may be laminated with a reinforcing plate.

The conductor may be formed of a suitable material having conductivity and formability, for example, a copper alloy plate. The conductor may be plated with nickel, and conductive hard plating may be further provided. A base end part of the conductor may be coated with a polyimide film.

The conductor may be formed by laminating (adhering) the elongated substrate and then by etching the laminated substrate. Each of the conductors may be connected to a low voltage power supply or a grounding wire.

The first contact may be formed of a copper alloy plate in order to ensure conductivity. Regarding the copper alloy plate, phosphor bronze plate or beryllium bronze plate are more preferable. The first contact may be formed of a thin plate of steel in order to ensure abrasive resistance.

The first contact may be provided with nickel plating or chrome plating. Gold flash plating may further be provided on the plated first contact in order to reduce the contact resistance.

Through-holes, vias, or pads-on-holes, etc., may be formed on the printed wiring board.

A pair of protrusions may be provided on the slider, and grooves to be fit with the protrusions may be provided on the FPC.

The width of the insertion opening may be slightly larger than the width of the first housing. The displacement of the FPC in a width direction can thus be controlled, and thereby the first conductor of the FPC and the line connecting terminals of the printed wiring board can be adjusted easily.

According to the invention described in (1), when the FPC is attached to the slider and inserted into the insertion opening of the printed wiring board, the first contact is pressed by the line connecting terminal provided in the insertion opening and by the conductor of the FPC, so as to be elastically deformed, and thus, the first contact contacts the line connecting terminal and the conductor. Thereby the conductor of the FPC and the line connecting terminal of the printed wiring board are electrically connected through the slider.

Therefore, the FPC can be connected to the printed wiring board on the edge surface of the printed wiring boar, allowing circuit elements to be mounted in high density, and improving freedom in designing wiring patterns.

Connection of an existing FPC having a substrate and a conductor onto a printed wiring board can be achieved simply by attaching the slider onto the existing FPC. The cost for connecting the printed wiring board and the FPC can thus be reduced.

The slider can align the plurality of the first contacts, and thereby ensures a connection of the FPC to the printed wiring board.

(2) In a connection structure for a printed wiring board according to (1), the first contact is bent in a substantially V-shape at a bending portion to protrude toward the conductor, and the FPC is inserted into the insertion opening of the printed wiring board so that the bending portion of the first contact presses the conductor and both edge portions of the first contact press the line connecting terminal.

The bending portion and both edge portions of the first contact may be contacted to the line connecting terminal and the conductor in a point, or line, or surface thereof. Curvature of the bending portion in the first contact is not limited.

According to the invention described in (2), when the FPC is attached to the slider and is inserted into the insertion opening of the printed wiring board, the bending portion and both edge portions of the first contact are pressed by the line connecting terminal provided in the insertion opening and by the conductor of the FPC, so as to be elastically deformed, and thus, the first contact contacts the line connecting terminal and the conductor.

(3) A connection structure for a printed wiring board to be electrically connected to a FPC, the FPC including: an elongated substrate, and plural conductors laminated on a surface of the substrate for extending along an axial direction of the substrate; the printed wiring board including: an insertion opening for a top end portion of the FPC to be inserted being provided at an edge surface, and plural line connecting terminals being formed on an internal wall surface of the insertion opening, the plurality of the line connecting terminals extending along an insertion direction of the FPC; the insertion opening including a relay connector including plural elastic deformable second contacts, and a header and a second housing for holding the plurality of the second contacts; the second contact including a main body for abutting on the top end portion of the FPC, and a pair of arms extending substantially parallel with each other in the insertion direction of the FPC from the main body, the pair of arms abutting on the line connecting terminal, the header holding the main body of the second contacts with the plurality of the second contacts formed in a row, the second housing holding one of the arms of the second contacts with the plurality of the second contacts formed in a row, the pair of arms of the relay connector pinching the conductor of the FPC by inserting the FPC into the insertion opening of the printed wiring board.

The FPC may be a FFC (Flexible Flat Cable).

The substrate may be formed of a thin-film polyimide plate.

Furthermore, the substrate may be laminated with a reinforcing plate.

The conductor may be formed of a suitable material having conductivity and formability, for example, a copper alloy plate. The conductor may be provided with nickel, and conductive hard plating may be further provided. A base end of the conductor may be coated with a polyimide film.

The conductor may be formed by laminating (adhering) the elongated substrate and then by etching the laminated substrate. Each of the conductors may be connected to a low voltage power supply or a grounding wire.

The second contact may be formed of a copper alloy plate in order to ensure conductivity. Regarding the copper alloy plate, phosphor bronze plate or beryllium bronze plate are more preferable. The second contact may be formed of a thin plate of steel in order to ensure abrasive resistance.

The second contact may be provided with nickel plating or chrome plating. Gold flash plating may further be provided on the plated second contact in order to reduce contact resistance.

Through-holes, vias, or pads-on-holes, etc., may be formed on the printed wiring board.

The width of the insertion opening may be slightly larger than the width of the second housing. The displacement of the FPC in the width direction can thus be controlled, thereby the second conductor of the FPC and the line connecting terminals of the printed wiring board can be adjusted easily.

According to the invention described in (3), the relay connector is inserted in the printed wiring board. Therefore, each of the arms of the second contacts of the relay connector abuts on the line connecting terminal.

The FPC is then inserted into the insertion opening of the printed wiring board. The pair of arms of the second contact pinches the conductor of the FPC. The conductor of the FPC and the line connecting terminal of the printed wiring board are thus electrically connected through the arms of the relay connector.

In this way, the FPC can be connected to the printed wiring board edge on the edge surface of the printed wiring board, allowing circuit elements to be mounted in high density, and improving freedom in designing wiring patterns.

Connection of an existing FPC having a substrate and a conductor onto a printed wiring board can be achieved simply by attaching the relay connector to the printed wiring board. The cost for connecting the printed wiring board and the FPC can thus be reduced.

The relay connector can align the plurality of the second contacts thereby ensuring a connection of the FPC to the printed wiring board.

(4) In a connection structure for a printed wiring board according to (3), each of the second contacts is provided with a stationary terminal protruding from a tip of the relay connector, the printed wiring board includes a through hole, and a communication hole for communicating the through hole and the insertion opening, the stationary terminal of the relay connector communicates with the communication hole and attached to the through hole by soldering.

The through hole may be formed by laminating a first external layer plate, an internal layer plate, and a second external layer plate and then by boring through the laminated plates.

According to the invention described in (4), the stationary terminal is fixed by soldering in the through hole in order to hold the relay connector in the insertion opening.

(5) In a connection structure for a printed wiring board according to (2), the first housing includes plural slits formed thereon, each of the plurality of the slits has the plurality of the first contacts compressed respectively therein.

When the first contact is pressed into the slit, one end of the first contact may be exposed from one surface of the first housing, and the other end of the first contact may be exposed from the other surface of the first housing.

(6) In a connection structure for a printed wiring board according to one of (3) and (4), the header is formed by being molded together with the plurality of the second contacts.

(7) In a connection structure for a printed wiring board according to one of (3) and (4), the header includes the plurality of the second contacts pressed therein.

(8) In a connection structure for a printed wiring board according to one of (3) and (4), the second housing is formed including plural substantially parallel grooves formed thereon, the other arms of the second contacts are pressed in the plurality of the grooves of the second housing.

(9) In a connection structure for a printed wiring board according to (2), the printed wiring board is formed by laminating a first external layer plate, an internal layer plate having a cut out portion formed on the edge surface, and a second external layer plate, the line connecting terminal is provided at a surface of the first external layer plate facing the cut our portion, the insertion opening is formed as surrounded by the external layer plate, the cut out portion of the internal layer plate, and the second external layer plate.

(10) In a connection structure for a printed wiring board according to (3), the printed wiring board is formed by laminating a first external layer plate, an internal layer plate having a cut out portion formed on the edge surface, and a second external layer plate, the line connecting terminal is provided at a surface of the first external layer plate facing the cut out portion, the insertion opening is formed as surrounded by the external layer plate, the cut out portion of the internal layer plate, and the second external layer plate.

(11) In a connection structure for a printed wiring board according to (10), the line connecting terminal is further provided at a surface of the second external layer plate facing the cut out portion.

The aforementioned first external layer plate, the internal layer plate, and the second external layer plate, and a prepreg, as will be discussed later, are typically made of epoxy resin. The material should not be limited to epoxy resin, and materials having heat resistance such as BT (Bismaleimide-Triazine) resin, etc; may be used for the formation. Furthermore, such materials having low dielectric constant as low dielectric constant epoxy resins, polyphenylene ether resins having a property of low dielectric constant may also be used.

The plate width of the internal plate is preferably 0.2 mm to 1.6 mm, and more preferably 0.6 mm to 1.0 mm.

The plate width of the first external layer plate and the second external layer plate is preferably 0.2 mm. The width of the copper foil is preferably 35 micrometers.

(12) In a connection structure for a printed wiring board according to one of (9) to (11), the first external layer plate and the second external layer plate further laminates a prepreg and a copper foil.

(13) A connection structure for a printed wiring board according to one of (9) to (11), wherein the line connecting terminal of the printed wiring board is hard-plated.

The hard-plating includes plating with nickel.

According to the invention described in (13), the hard-plated line connecting terminal can reduce friction of the line connecting terminals with the first contact and the second contact and prevent wear thereof even when the FPC is inserted into the printed wiring board repeatedly. The line connecting terminal particularly tends to be worn when the printed wiring board is formed of glass epoxy materials because the surface of the printed wiring board is similar to a rough grind stone.

(14) In a connection structure for a printed wiring board according to (13), the line connecting terminal of the printed wiring board is further gold plated on the hard-plated surface.

According to the invention described in (14), the line connecting terminal is provided with hard plating and further with gold flash plating in order to make the line connecting terminal a better contact point.

DETAILED DESCRIPTION OF PREFERRED EMBODIMENTS

With reference to drawings, each embodiments of the present invention will be described hereinafter in detail. In the descriptions of the below embodiments, identical components are given identical numerals and explanation thereof is omitted or simplified for the sake of brevity.

First Embodiment

Figure 1:
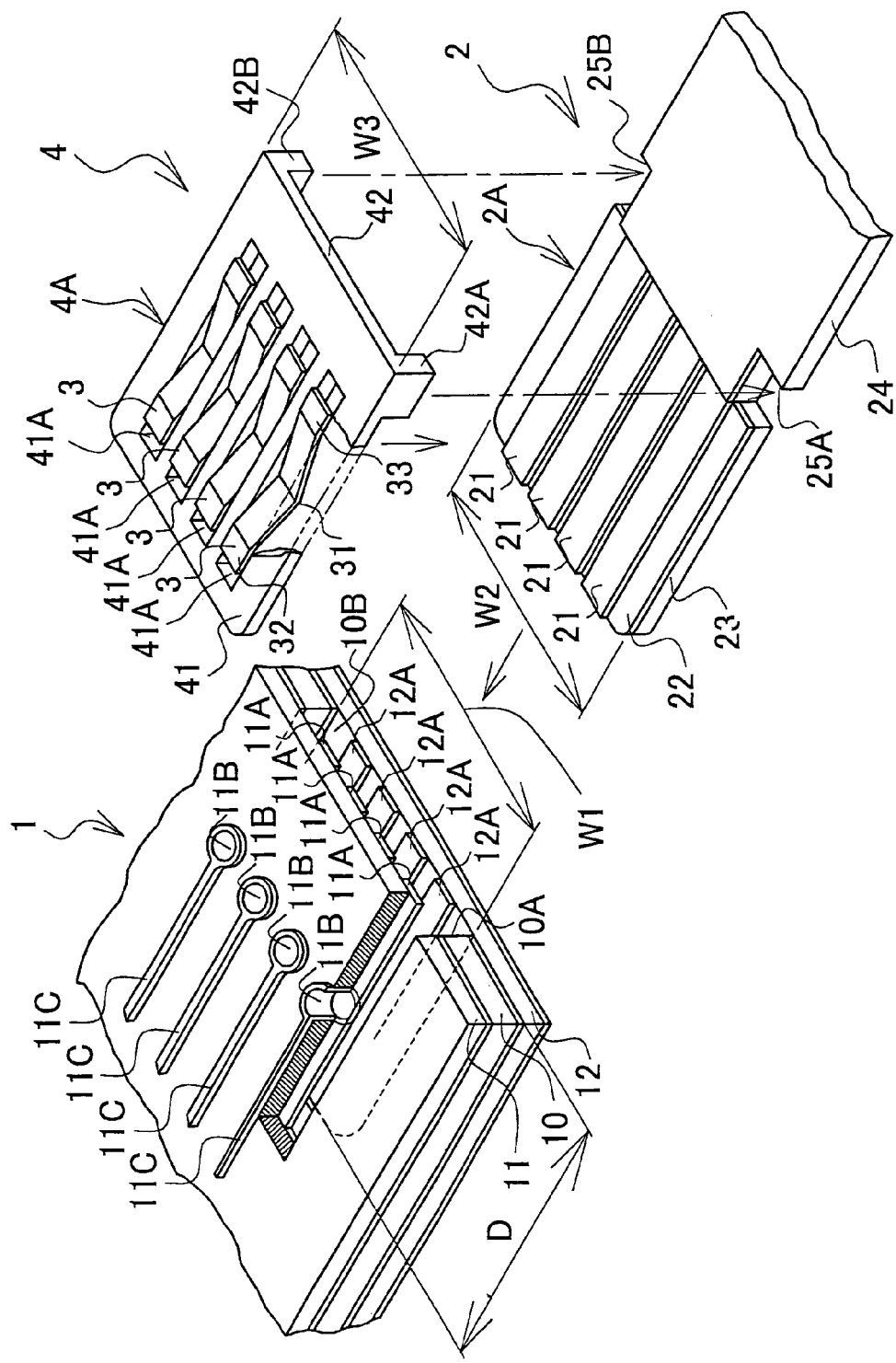
FIG. 1 is a perspective view showing a FPC and a printed wiring board according to a first embodiment of the present invention.

FIG. 1 is a perspective view showing a FPC and a printed wiring board according to a first embodiment of the present invention.

The FPC 2 includes an elongated substrate 22, a reinforcing plate 23 bonded to the lower surface of the substrate 22, plural conductors 21 laminated on the upper surface of the substrate 22 and extending along an axial direction thereof.

The FPC 2 is coated with a polyimide film 24 with a top end portion exposed to form an exposed conductor 2A having a width W2. A pair of rectangular cut out portions 25A and 25B is formed at both ends in the width direction near a boundary between the exposed conductor 2A of the FPC 2 and the polyimide film 24.

The substrate 22 has an insulation property and is formed, for example, of a thin-film polyimide plate.

The conductor 21 is formed of a suitable material having conductivity and formability and is provided with nickel plating.

A slider 4 including plural elastic deformable first contacts 3 and a first housing 4A for holding the plurality of the first contacts 3 is assembled over the top end portion of the FPC 2.

The first contact 3 is bent in a substantially V shape at a bending portion 31 and protrudes toward the conductor 21. The first contact 3 is bent to form edge portions 32 and 33 at both ends.

The first housing 4A has a planar housing body 41, a pair of square pole-shaped protrusions 42A and 42B formed at a base end side of the housing body 41 and at the same time at both ends in the width direction.

The housing body 41 has plural slits 41A extending from the base end side to the top end side thereof. Each of the first contacts 3 is pressed in the respective slit 41A, so that the bending portion 31 of the first contact 3 protrudes from one surface of the housing body 41 while both edge portions 32 and 33 protrude from the other surface of the housing body 41. The bending portion 31 of the first contact 3 is fixed at the slit 41A.

The base end portion of the housing body 41 serves as a holding portion 42.

The protrusions 42A and 42B are fit to a pair of cut out portions 25A and 25B, respectively.

Figure 2:
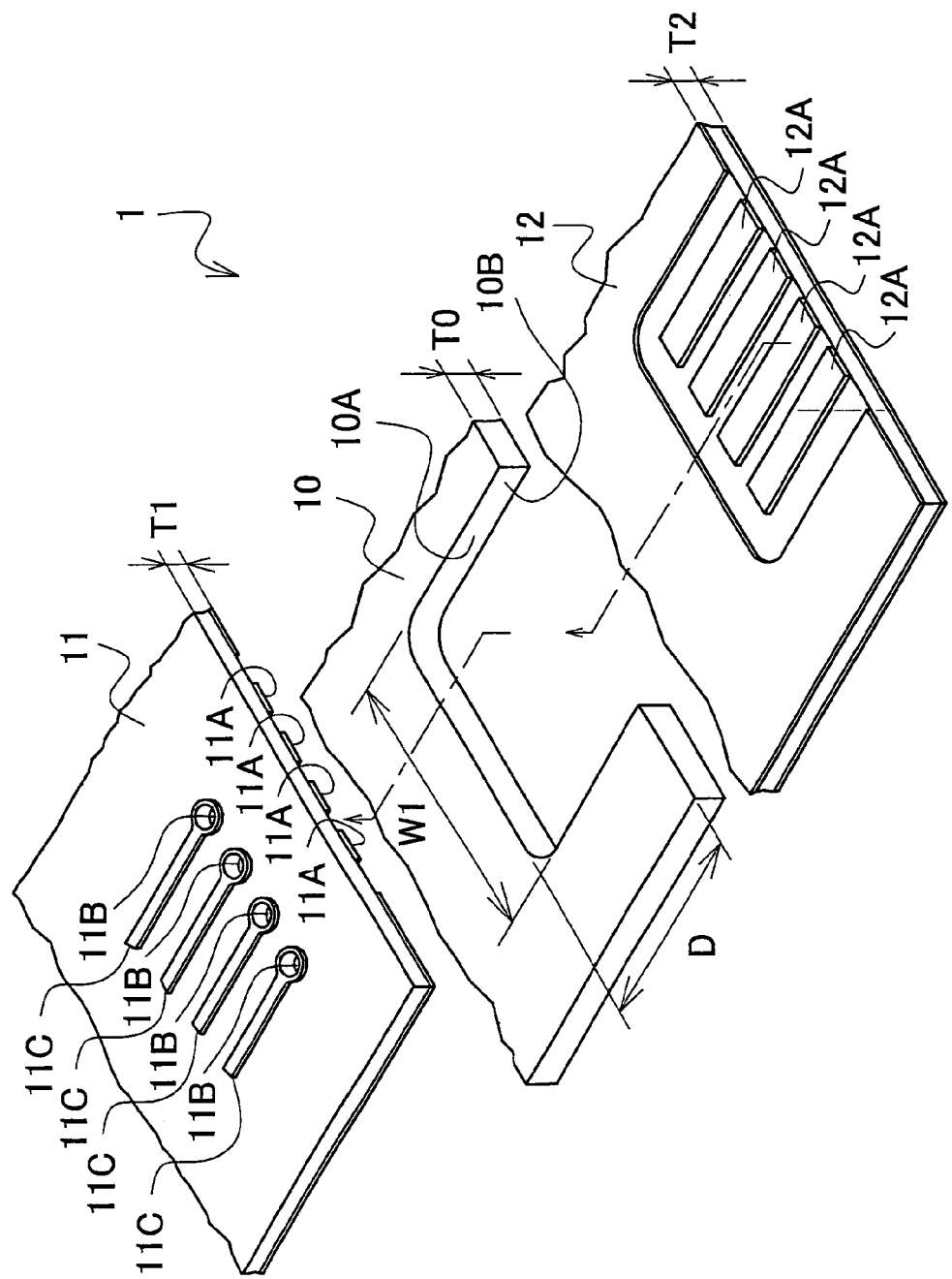
FIG. 2 is an exploded perspective view of a printed wiring board according to aforementioned embodiment.

FIG. 2 is an exploded perspective view of the printed wiring board 1.

The printed wiring board 1 has a configuration formed by laminating a first external plate 11, an internal layer plate 10, and a second external layer plate 12.

The internal layer plate 10 is formed of an insulative plate member, more specifically an epoxy glass plate in this embodiment. The internal layer plate 10 has a plate thickness T0, and has a cut out portion 10A extending to an edge surface of the internal layer plate 10, and having a width W1 and a depth dimension D.

The first external layer plate 11 has a plate thickness T1, which is 0.2 mm in this embodiment. On both surfaces of the first external layer plate 11, line connecting terminals 11A and wiring patterns 11C exposed on the surface are provided by print-etching copper foils. Specifically, the thickness of the copper foil is 35 micrometers. After the wiring pattern 11C has formed, through-holes are formed.

The second external layer plate 12 has a plate thickness T2, which is 0.2 mm in this embodiment. On a surface of the second external layer plate 12, the surface facing the internal layer plate 10, a copper foil is print-etched to provide a line connecting terminal 12A. Specifically, the thickness of the copper foil is 35 micrometers.

The printed wiring board 1 is manufactured by the steps described below.

Specifically, the first external layer plate 11, the internal layer plate 10, and the second external layer plate 12 are laminated and pressed in this order and integrated by solder plating. The integrated plate members 10 to 12 are formed with through-holes, vias, pads-on-holes etc., and then subjected to soldering and resist processing.

The first external layer plate 11, a cut out portion 10A of the internal layer plate 10, and the second external layer 12 are provided on an edge surface of the printed wiring board 1 to form an insertion opening 10B for the top portion of the FPC 2 to be inserted.

The width W1 of the cut out portion 10A is slightly larger than the width W2 of the FPC 2. The cut out portion 10A can thus control displacement of the FPC 2 in the width direction, and thereby the first conductor 3 of FPC 2 and the line connecting terminals 11A and 12A of the printed wiring board can be adjusted easily.

Figure 3:
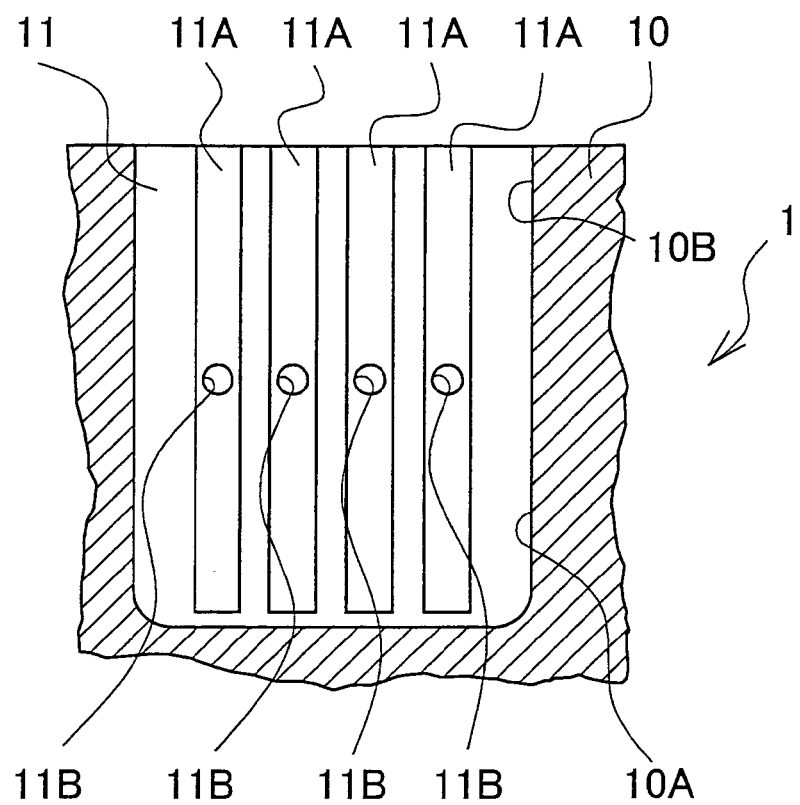
FIG. 3 is a cross sectional view of a first external layer plate as viewed from a cut out portion according to the aforementioned embodiment.

FIG. 3 is a cross sectional view of the first external layer plate 11 as viewed from the side facing the cut out portion 10A according to the aforementioned embodiment.

The line connecting terminals 11A extend along an insertion direction of the FPC 2 on the first external layer plate 11, the first external layer plate forming an internal wall surface of the insertion opening 10B. These line connecting terminals 11A are arranged in a portion corresponding to both edge portions 32 and 33 of the first contact 3 of the FPC 2.

As shown in FIG. 2, the line connecting terminals 12A extend along the insertion direction of the FPC 2 on the second external plate 12 forming the internal wall surface of the insertion opening 10B. These line connecting terminals 12A are arranged in a portion corresponding to both edge portions 31 and 32, of the first contact 3 of the FPC 2.

The line connecting terminals 11A and 12A may be plated with nickel as hard plating. The line connecting terminals 11A and 12A may be hard plated with any materials other than nickels. This reduces friction and prevents wear of the line connecting terminals 11A and 12A with both edge portions 31 and 32 of the first contact 3 even when the FPC 2 is inserted into the printed wiring board 1 repeatedly. The line connecting terminals 11A and 12A particularly tend to be worn when the printed wiring board 1 is formed of glass epoxy materials because the surface of the printed wiring board 1 is similar to rough grind stone.

On the surface of the nickel plating, gold flash plating may further be provided. This ensures the line connecting terminals 11A and 12A have better contact points.

On the first external layer plate 11 of the printed wiring board 1, plural through holes 11B are formed to be connected to the line connecting terminal 12A. The wiring pattern 11C formed on the surface of the first external layer plate 11 is electrically connected with the line connecting terminal 12A through the through hole 11B.

Figure 4:
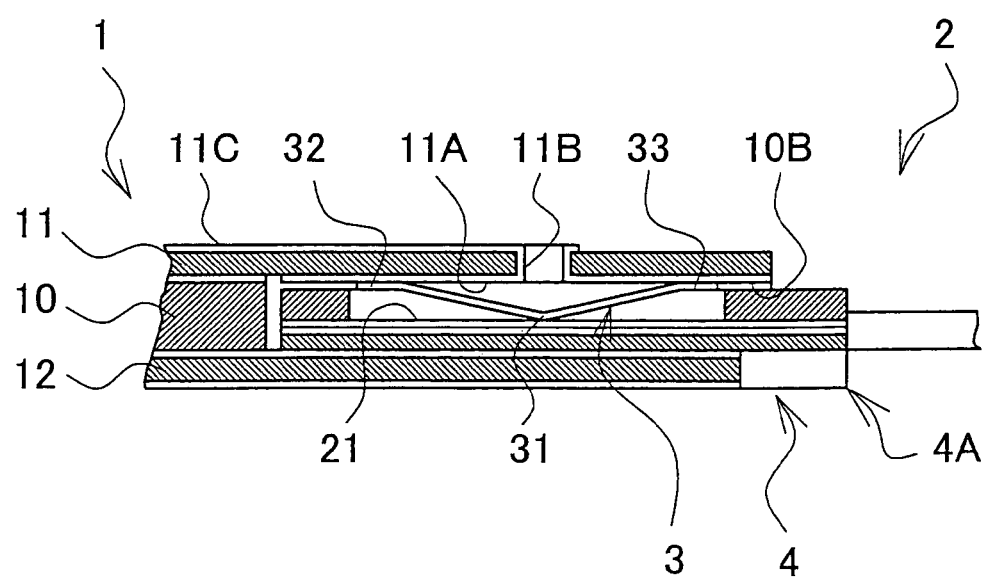
FIG. 4 shows a process for inserting the FPC into the printed wiring board according to the aforementioned embodiment.

With reference to FIG. 4, a process of inserting the FPC 2 into the printed wiring board 1 will be described hereinafter.

When the FPC 2 is attached to the slider 4 and inserted in the insertion opening 10B of the printed wiring board 1, the bending portion 31 and both edge portions 32 and 33 of the first contact 3 are pressed to the line connecting terminal 11A in the insertion opening 10B and the conductor 21 of the FPC 2 so as to be elastically deformed. As a result, the bending portion 31 contacts the line connecting terminal 11A, and each of the edge portions 32 and 33 contacts the conductor 21. Thereby, the conductor 21 of the FPC 2 and the line connecting terminal 11A of the printed wiring board 1 are electrically connected through the slider 4.

When the FPC 2 is inserted deeper, the tip of the slider 4 abuts on the internal wall surface of the insertion opening 10B.

Second Embodiment

This embodiment differs from the first embodiment in the configuration of a printed wiring board 9 and a FPC 5.

Figure 5:
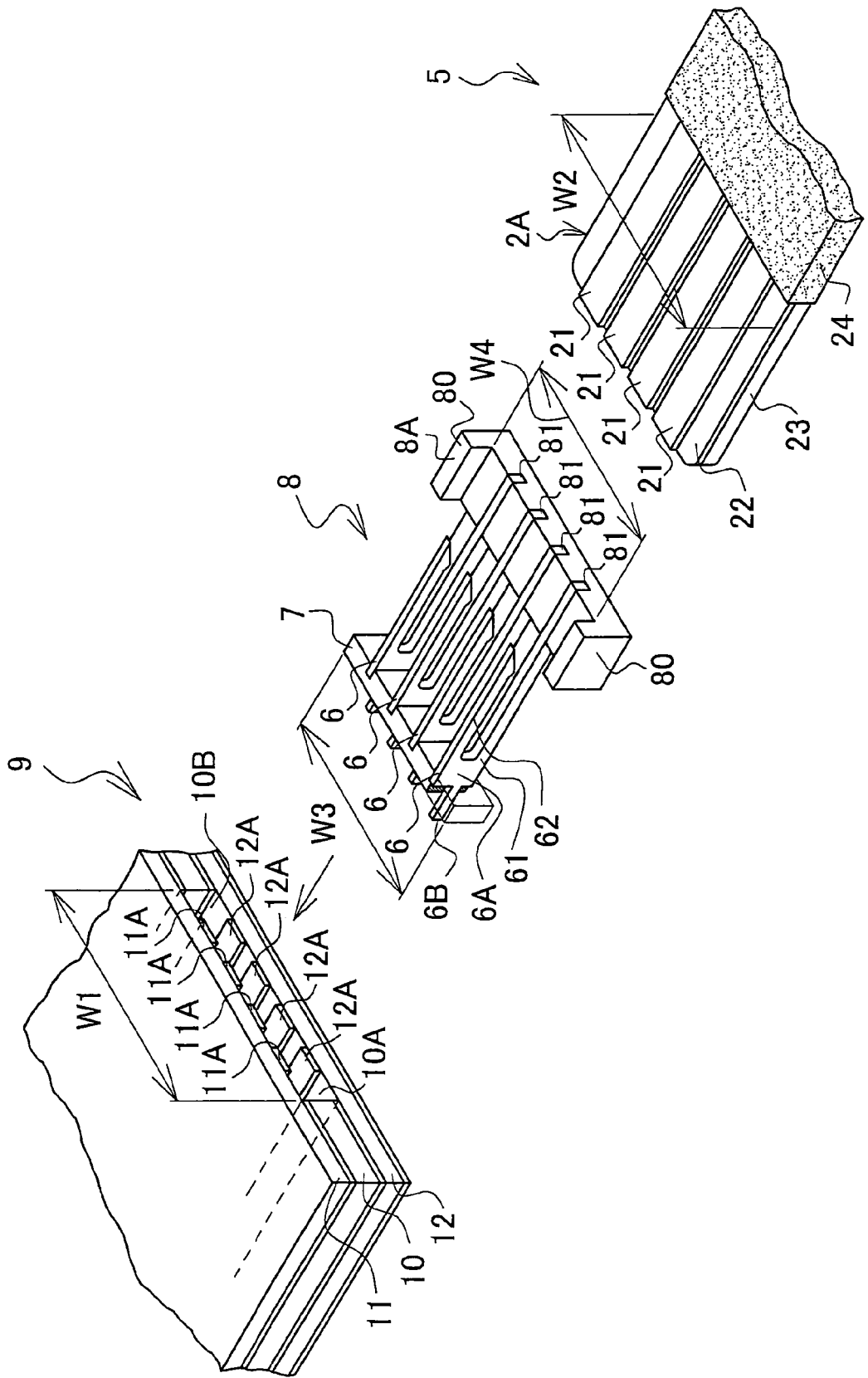
FIG. 5 is a perspective view showing a FPC and a printed wiring board according to a second embodiment of the present invention.

FIG. 5 is a perspective view showing the FPC 5 and the printed wiring board 9 according to the second embodiment of the present invention.

Inside of the insertion opening 10B of the printed wiring board 9, a relay connector 8 is attached The relay connector 8 has plural elastic deformable second contacts 6, a header 7 and a second housing 8A holding the plurality of the second contacts 6.

The second contact 6 has a main body 6A abutting on the top end portion of the FPC 5, a pair of arms 61 and 62 extending substantially parallel with each other in an insertion direction from the main body 6A to the FPC 5.

The arm 62 abuts on the line connecting terminal 11A.

The gap between one arm 61 and the other arm 62 is slightly smaller than the width of the FPC 5. When the top end portion of the FPC 5 is inserted into the second contact 6, the arms 61 and 62 are deformed to contact the second contact 6 at a predetermined contact pressure 21.

The header 7 holds the main body 6A of the second contact 6 with the plurality of the second contacts 6 formed in a row. The header 7 is formed of synthetic resins and molded with the second contacts 6. The width W3 of the header 7 is substantially similar with the width W1 of the FPC 5.

According to this embodiment of the present invention, the plurality of the second contacts 6 thus ensures proper alignment. Therefore, the FPC 5 can be connected to the printed wiring board 9 more reliably.

In the main body 6A of the second contact 6, a stationary terminal 6B is formed extending through the header 7 and protruding from a tip of the relay connector 8.

The second housing 8A holds the arm 62 of the second contact 6 with the plurality of the second contacts 6 formed in a row. The second housing 8A has plural grooves 81 substantially parallel with each other formed on the housing, and each of the arms 62 of the second contacts 6 is respectively pressed in each of the grooves 81.

The width W1 of the cut out portion 10A is slightly larger than the width W3 of the header 7. The cut out portion 10A can thus control the displacement of the FPC 5 in the width direction, and thereby the second contact 6 and line connecting terminals 11A of the printed wiring board 9 can be adjusted easily.

A pair of protrusions 80 is formed on the second housing 8A. The distance W4 between the pair of protrusions 80 is slightly larger than the width W2 of the FPC 5. The protrusions 80 can thus control the displacement of the FPC 5 in the width direction.

Figure 6:
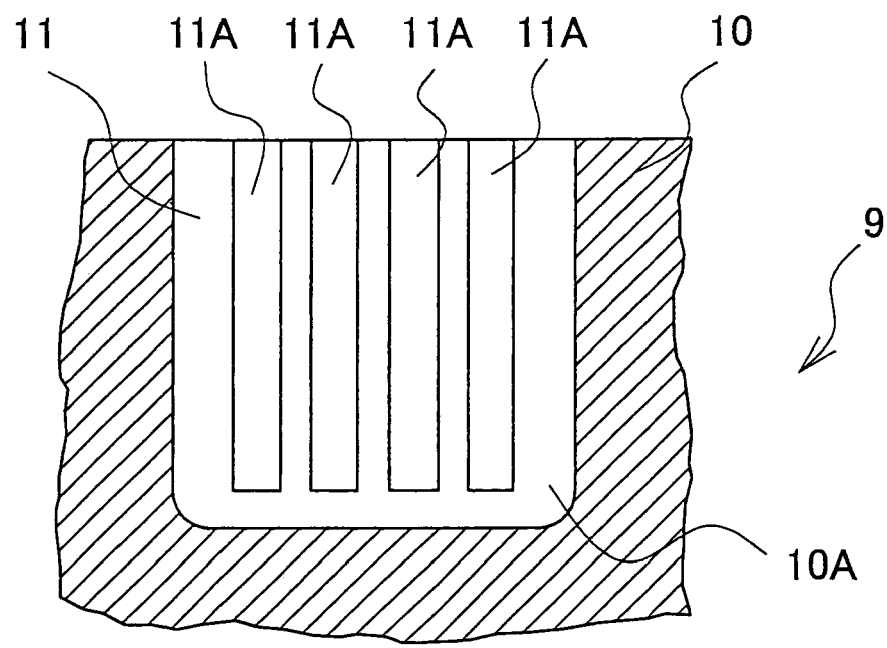
FIG. 6 is a cross sectional view of a first external layer plate as viewed from a cut out portion according to the aforementioned embodiment.

FIG. 6 is a cross sectional view of a first external layer plate 11 as viewed from a cut out portion 10A.

Figure 7:
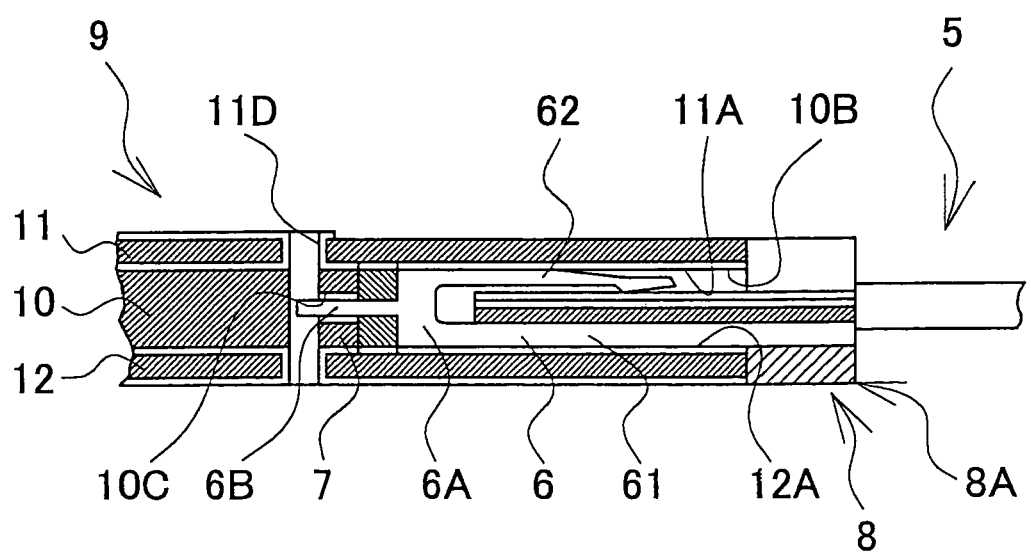
FIG. 7 is a longitudinal sectional view showing the FPC inserted into the printed wiring board according to the aforementioned embodiment.

FIG. 7 is a longitudinal sectional view showing the FPC 5 inserted into the printed wiring board 9.

On the printed wiring board 9, through holes 11D extending from the front surface through to the back surface, and communication holes 10C communicating the through hole 11D and insertion opening 10B, are formed.

The stationary terminal 6B protrudes through the communication hole 10C to the through hole 11D. The stationary terminal 6B is attached to the through hole 11D by soldering. The second contact 6 of the relay connector 8 is fixed to the inside of the printed wiring board 8 to prevent rattling of the relay connector 8 even when the FPC 5 is inserted into the printed wiring board 9 repeatedly.

With reference to FIG. 7, a process of inserting the FPC 5 into the printed wiring board 9 will be described.

Firstly, the FPC 5 is attached to the printed wiring board 9. Each of the pair of arms 61 and 62 of the second contact 6 in the relay connector 8 abuts on the line connecting terminal 11A.

The FPC 5 is then inserted into the insertion opening 10B in the printed wiring board 9. The pair of arms 61 and 62 of the second contact 6 pinches the conductor 21 of the FPC 5. The conductor 21 of the FPC 5 and the line connecting terminal 11A of the printed wiring board 9 are thus electrically connected through arms 61 and 62 of the relay connector 8.

The present invention has advantageous effects shown below:

When the FPC is attached to the slider and inserted into the insertion opening of the printed wiring board, the first contact is pressed by the line connecting terminal in the insertion opening and the conductor of the FPC to cause elastic deformation, and thus the first contact is contacting the line connecting terminal and the conductor. The conductor of the FPC and the line connecting terminal of the printed wiring board are thereby electrically connected through the slider.

Therefore, the FPC can be connected to the printed wiring board on the edge surface of the printed wiring board, allowing circuit elements to be mounted in high density, and improving freedom in designing wiring patterns.

An existing FPC having a substrate and a conductor can be connected to the printed wiring board simply by attaching a slider onto the existing FPC. The cost for connecting the printed wiring board and FPC can thus be reduced.

The slider can align the plurality of the first contact, thereby ensuring a connection of the FPC to the printed wiring board.

The invention claimed is:

1. A connection structure for a printed wiring board to be electrically connected to a FPC, said FPC comprising:
an elongated substrate; and a plurality of conductors laminated on a surface of said substrate and extending along an axial direction of said substrate;
said printed wiring board comprising: an insertion opening; a plurality of line connecting terminals; a through hole; and a communication hole for communicating said through hole and said insertion opening; said insertion opening provided at an edge surface for a top end portion of said FPC to be inserted, said plurality of said line connecting terminals formed on an internal wall surface of said insertion opening and extending along an insertion direction of said FPC;
said insertion opening comprising and attached therein a relay connector including plural elastic deformable second contacts, and a header and a second housing for holding said plurality of said second contacts;
said second contact comprising a main body and a pair of arms, said main body abutting on said top end portion of said FPC, said pair of said arms extending substantially parallel with each other in said insertion direction of said FPC from said main body and abutting on said line connecting terminal, each of said second contacts is provided with a stationary terminal protruding from a tip of said relay connector;
said header holding said main body of said second contacts with said plurality of said second contacts formed in a row;
said second housing holding one of said arms of said second contacts with said plurality of said second contacts formed in a row, wherein
said pair of arms of said relay connector pinching said conductor of said FPC by inserting said FPC into said insertion opening of said printed wiring board,
said stationary terminal of said relay connector communicates with said communication hole and is attached to said through hole by soldering.

2. A connection structure for a printed wiring board according to claim 1, wherein said header is formed by being molded together with said plurality of said second contacts.

3. A connection structure for a printed wiring board according to claim 1, wherein said header holds said plurality of said second contacts pressed therein.

4. A connection structure for a printed wiring board according to claim 1, wherein said second housing comprises plural substantially parallel grooves formed thereon, the other arms of said second contact is pressed in said plurality of said grooves of said second housing.

5. A connection structure for a printed wiring board according to claim 1, wherein said printed wiring board is formed by laminating a first external layer plate, an internal layer plate having a cut out portion formed on the edge surface, and a second external layer plate,
said line connecting terminal is provided at a surface of said first external layer plate facing said cut out portion,
said insertion opening is formed as surrounded by said external layer plate, said cut out portion of said internal layer plate, and said second external layer plate.

6. A connection structure for a printed wiring board according to claim 1, wherein said line connecting terminal is further provided at a surface of said second external layer plate facing said cut out portion.

7. A connection structure for a printed wiring board according to claim 1, wherein said first external layer plate and said second external layer plate further laminates a prepreg and a copper foil.

8. A connection structure for a printed wiring board according to claim 1, wherein said header is formed by being molded together with said plurality of said second contacts.

9. A connection structure for a printed wiring board according to claim 1, wherein said header holds said plurality of said second contacts pressed therein.

10. A connection structure for a printed wiring board according to claim 1, wherein said second housing comprises plural substantially parallel grooves formed thereon, the other arms of said second contact is pressed in said plurality of said grooves of said second housing.

11. A connection structure for a printed wiring board according to claim 1, wherein said printed wiring board is formed by laminating a first external layer plate, an internal layer plate having a cut out portion formed on the edge surface, and a second external layer plate,
  said line connecting terminal is provided at a surface of said first external layer plate facing said cut out portion.

12. A connection structure for a printed wiring board according to claim 1, wherein said line connecting terminal of said printed wiring board is hard-plated.

13. A connection structure for a printed wiring board according to claim 12, wherein said line connecting terminal of said printed wiring board is further gold plated on said hard-plated surface.

* * * * *